US012665580B2

(12) United States Patent
Wang et al.

(10) Patent No.: US 12,665,580 B2
(45) Date of Patent: Jun. 23, 2026

(54) CLOCK DETECTION METHOD, CLOCK DETECTION CIRCUIT, AND IMAGE SENSOR

(71) Applicant: Smartsens Technology (HK) Co., Limited, Hongkong (CN)

(72) Inventors: Yunqi Wang, Shanghai (CN); Xiaoxing Li, Shanghai (CN)

(73) Assignee: SMARTSENS TECHNOLOGY (HK) CO., LIMITED, Hongkong (CN)

( * ) Notice: Subject to any disclaimer, the term of this patent is extended or adjusted under 35 U.S.C. 154(b) by 51 days.

(21) Appl. No.: 19/012,920

(22) Filed: Jan. 8, 2025

(65) Prior Publication Data

US 2026/0051878 A1 Feb. 19, 2026

(30) Foreign Application Priority Data

Aug. 19, 2024 (CN) ......................... 202411138922.9
Aug. 19, 2024 (CN) ......................... 202422009659.5

(51) Int. Cl.

| | |
|---|---|
| ***H03K 3/037*** | (2006.01) |
| ***H03K 5/19*** | (2006.01) |
| ***H03K 17/687*** | (2006.01) |
| ***H03K 19/20*** | (2006.01) |
| ***H04N 25/69*** | (2023.01) |
| *H04N 25/76* | (2023.01) |

(52) U.S. Cl.
CPC ............... *H03K 3/037* (2013.01); *H03K 5/19* (2013.01); *H03K 17/687* (2013.01); *H03K 19/20* (2013.01); *H04N 25/69* (2023.01); *H04N 25/7795* (2023.01)

(58) Field of Classification Search
CPC ........ H03K 3/037; H03K 5/19; H03K 17/687; H03K 19/20
See application file for complete search history.

(56) References Cited

U.S. PATENT DOCUMENTS

| | | | | |
|---|---|---|---|---|
| 10,180,695 | B1 * | 1/2019 | Bikulcius ................ | G05F 1/468 |
| 2015/0270836 | A1 * | 9/2015 | Kumar ..................... | H03K 5/22 327/20 |
| 2018/0054163 | A1 * | 2/2018 | Chen ....................... | H03K 19/20 |
| 2021/0096592 | A1 * | 4/2021 | Hanschke ............. | H04L 7/0037 |

* cited by examiner

*Primary Examiner* — Sibin Chen
(74) *Attorney, Agent, or Firm* — Andrew C. Cheng

(57) ABSTRACT

The present application provides a clock detection method, a clock detection circuit, and an image sensor, wherein an first AND gate is receiving a first clock signal and an enable signal, a first capacitor is connected to a first switch element, and a second capacitor is connected between the first switch element and ground, the second switch element receives a preset voltage, and the second switch element is connected to the first switch element; a comparator is connected to the second switch element, and a preset voltage end, and an output end of the comparator is connected to a trigger; a trigger end of the trigger is receiving the first clock signal, and the reset end of the trigger is receiving the enable signal, to output a clock detection result signal. The present application enhances the user experience.

15 Claims, 3 Drawing Sheets by invalidating the enable signal, controlling the first switch element to ground both ends of the first capacitor, and controlling the second switch element to conduct and charge the second capacitor to the first preset voltage, wherein the first preset voltage is greater than the second preset voltage    ⌐∿S10 controlling the second switch element to cut off, flipping the enable signal to be effective, based on the first clock signal, causing the first switch element to alternate conduction, to control the first end of the first capacitor to alternate between grounding and connecting to the second capacitor, so that an input voltage at the positive input end of the comparator conforms to a first preset function expression, wherein a capacitance value of the first capacitor is less than that of the second capacitor.    ⌐∿S20 when a voltage value of the second capacitor drops to less than the second preset voltage, the output voltage of the comparator flips, and based on the Taylor expansion of the first preset function expression, acting a pulse width of the clock detection result signal as a frequency detection result of the first clock signal    ⌐∿S30

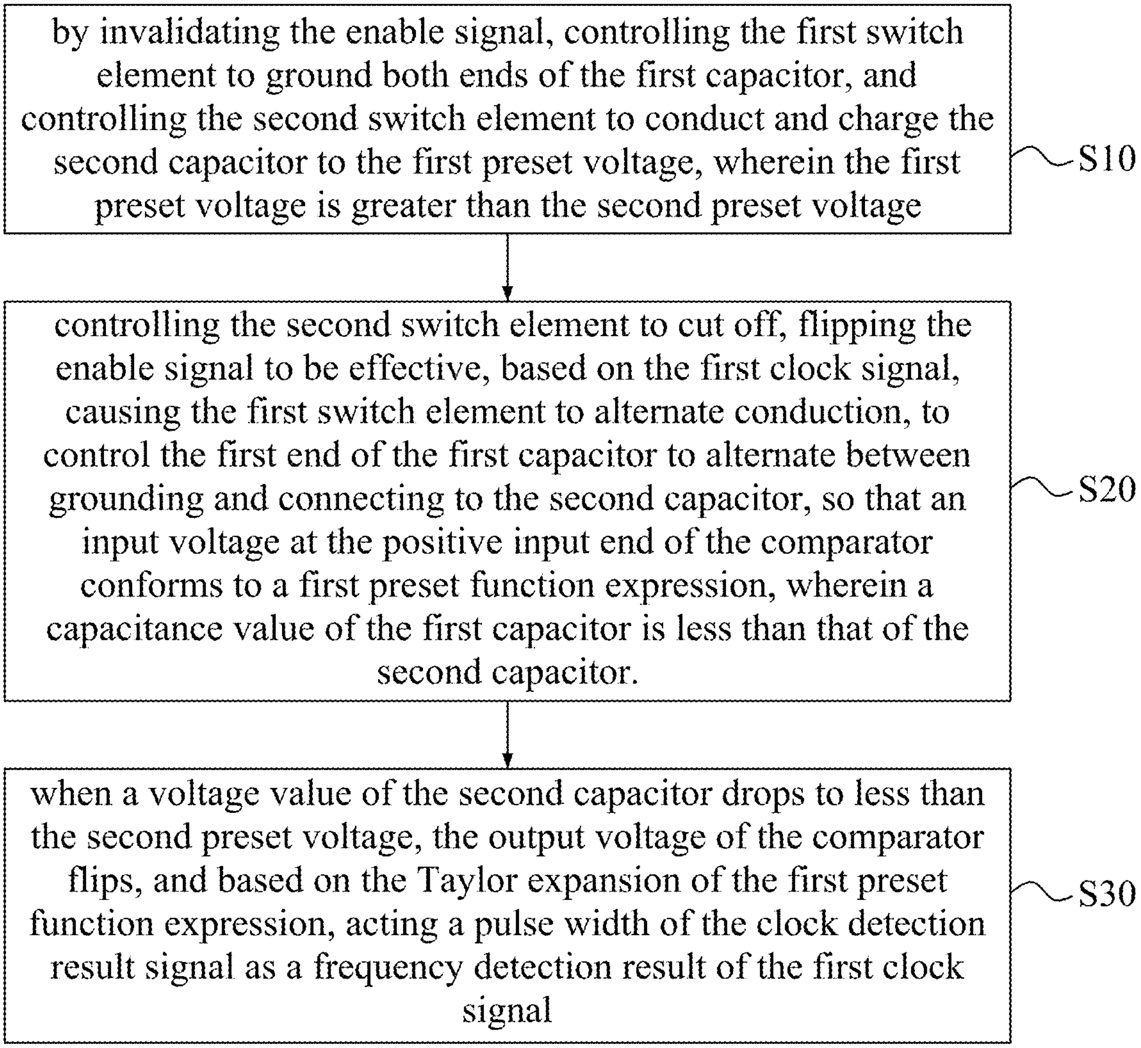

FIG. 3

CLOCK DETECTION METHOD, CLOCK DETECTION CIRCUIT, AND IMAGE SENSOR

CROSS-REFERENCE TO RELATED APPLICATIONS

This application is based upon and claims the priority to Chinese Patent Application No. 202411138922.9 and No. 202422009659.5, filed on Aug. 19, 2024, which are incorporated herein by reference in them entirety.

TECHNICAL FIELD

The present application relates to the field of image sensor technology, specifically involving a clock detection circuit, a clock detection method and an image sensor.

BACKGROUND

Image sensors have been widely applied in imaging fields such as video, surveillance, industrial manufacturing, automotive, and home appliances. The clock circuit in image sensors is an essential part of their analog-to-digital circuits. Under the accurate drive of the clock circuit, image sensors transmit sampled signals to digital processing modules for processing. The system clock input of a chip is often provided by a crystal oscillator, serving as the reference clock for the entire chip. Its frequency determines the normal operation of various internal clocks of the chip. Detecting whether the system clock frequency is within the designed value is crucial for monitoring the normal operation of the chip.

During the conception and formation of the present application, the applicant found that common clock frequency detection circuits are often complex, requiring counters, operational amplifiers, etc., which consume a significant amount of hardware resources and power consumption, and there are issues with circuit stability. Therefore, how to achieve input clock frequency detection with a stable clock frequency detection circuit that has a small layout area and low power consumption is an urgent problem that needs to be solved.

SUMMARY OF THE DISCLOSURE

To alleviate the aforementioned issues, this application provides a clock detection circuit, wherein it includes a first AND gate, a first switch element, a second switch element, a first capacitor, a second capacitor, a comparator, and a flip-flop; a first input end of the first AND gate is configured to receive an enable signal, a second input end of the first AND gate is configured to receive a first clock signal, and an output end of the first AND gate is connected to a control end of the first switch element; a first end of the first capacitor is connected to a first end of the first switch element, a second end of the first capacitor is grounded, and the second capacitor is connected between a second end of the first switch element and ground, and a third end of the first switch element grounded; a first end of the second switch element is connected to a first preset voltage, and a second end of the second switch element is connected to the second end of the first switch element; a positive input end of the comparator is connected to the second end of the second switch element, a negative input end of the comparator is connected to a second preset voltage, and an output end of the comparator is connected to an input end of the flip-flop; a trigger end of the flip-flop is connected to the second input end of the first AND gate, a reset end of the flip-flop is connected to the first input end of the first AND gate, and an output end of the flip-flop outputs a clock detection result signal.

In one embodiment, the clock detection circuit further includes a frequency-up circuit, wherein an input end of the frequency-up circuit is connected to the second input end of the first AND gate, and an output end of the frequency-up circuit is connected to the trigger end of the flip-flop, the frequency-up circuit is configured to increase trigger frequency of the trigger end to avoid the delay in the clock detection result signal outputted from the output end of the flip-flop.

In one embodiment, the first switch element includes a first transfer gate and a second transfer gate; a first control end of the first transfer gate is configured to receive the first control signal outputted from the output end of the first AND gate, the second control end of the first transfer gate is configured to receive a second control signal, an input end of the first transfer gate is served as the first end of the first switch element, and an output end of the first transfer gate is grounded; a first control end of the second transfer gate is connected to the second control signal, a second control end of the second transfer gate is configured to receive the first control signal output from the output end of the first AND gate, an output end of the second transfer gate is connected to the second end of the second switch element, and an input end of the second transfer gate is connected to the input end of the first transfer gate; wherein, the first control signal and the second control signal are complementary control signals.

In one embodiment, the second switch element is a field-effect transistor.

In one embodiment, the clock detection circuit further includes a signal stabilization unit, wherein the signal stabilization unit is connected to the output end of the flip-flop.

In one embodiment, the signal stabilization unit includes a first NOT gate and a second NOT gate, wherein an input end of the first NOT gate is connected to the output end of the flip-flop, an output end of the first NOT gate is connected to an input end of the second NOT gate, and the output end of the second NOT gate outputs the clock detection result signal.

In one embodiment, the clock detection circuit is wherein the first preset voltage is greater than the second preset voltage.

In one embodiment, a capacitance value of the first capacitor is less than a capacitance value of the second capacitor.

This application also provides a clock detection method, wherein it is applied to the clock detection circuit as described in above, the clock detection method includes: by invalidating the enable signal, controlling the first switch element to ground both ends of the first capacitor, controlling the second switch element to conduct and charge the second capacitor to the first preset voltage, wherein the first preset voltage is greater than the second preset voltage; controlling the second switch element to cut off, flipping the enable signal to be effective, based on the first clock signal, causing the first switch element to alternate conduction, to control the first end of the first capacitor to alternate between grounding and connecting to the second capacitor, so that an input voltage at the positive input end of the comparator conforms to a first preset function expression, wherein a capacitance value of the first capacitor is less than a capacitance value of the second capacitor; when a voltage value of the second capacitor drops to less than the second preset voltage, the output voltage of the comparator flips, and based on the Taylor expansion of the first preset function expression, acting a pulse width of the clock detection result signal as a frequency detection result of the first clock signal.

In one embodiment, the first preset function expression is:

$$V_{in} = \left(1 - \frac{C_1}{C_1 + C_2}\right)^n V_1$$

the Taylor expansion expression of the first preset function expression is:

$$V_{in} = \left(1 - n\frac{C_1}{C_1 + C_2} + \frac{n(n-1)}{2}\left(\frac{C_1}{C_1 + C_2}\right)^2 + \dots\right)V_1$$

wherein, Vin is the input voltage at the positive input end of the comparator, C1 is the capacitance value of the first capacitor, C2 is the capacitance value of the second capacitor, V1 is the voltage value of the first preset voltage, and n is a number of cycles.

In one embodiment, the second preset voltage is greater than a predetermined voltage value, and the predetermined voltage value is positively correlated with a precision of the frequency detection result of the first clock signal.

In one embodiment, a process of acting the pulse width of the clock detection result signal as the frequency detection result of the first clock signal based on the Taylor expansion of the first preset function expression includes: fixing a number of cycles for the comparator output to flip, making the frequency of the first clock signal linearly related to the pulse width of the clock detection result signal.

In one embodiment, a process of detecting the pulse width of the clock detection result signal as the frequency detection result of the first clock signal based on the Taylor expansion of the first preset function expression includes: according to the first clock signal's clock frequency being directly proportional to the pulse width of the clock detection result signal, determining the detection result of the first clock signal through the pulse width of the clock detection result signal.

This application also provides an image sensor, wherein it includes the clock detection circuit as described in above.

This application also provides an image sensor, wherein the image sensor includes a memory and a processor, wherein the memory stores a computer program, and the computer program, when executed by the processor, implements the steps of the clock detection method as described in above.

The clock detection method, clock detection circuit, and image sensor provided by the present application involve receiving an enable signal at the first input end of the first AND gate, receiving a first clock signal at the second input end of the said first AND gate, and connecting the output end of the said first AND gate to the control end of the said first switch element; the first end of the said first capacitor is connected to the first end of the said first switch element, the second end of the said first capacitor is grounded, and the said second capacitor is connected between the second end of the said first switch element and ground, with the third end of the said first switch element grounded; the first end of the said second switch element receives a first preset voltage, and the second end of the said second switch element is connected to the second end of the said first switch element; the positive input end of the said comparator is connected to the second end of the said second switch element, the negative input end of the said comparator is connected to a second preset voltage, and the output end of the said comparator is connected to the input end of the said flip-flop; the trigger end of the said flip-flop is connected to the second input end of the said first AND gate, the reset end of the said flip-flop is connected to the first input end of the said first AND gate, and the output end of the said flip-flop outputs a clock detection result signal. By employing the input system clock detection circuit, the present application is capable of determining whether the input system clock frequency meets the design requirements, thereby enhancing the user experience.

BRIEF DESCRIPTION OF THE DRAWINGS

The figures included herein are incorporated into the specification and form a part of this description, illustrating embodiments in accordance with the present application, and are used in conjunction with the specification to explain the principles of the application. To more clearly illustrate the technical solution of the embodiments of the present application, a brief introduction to the figures required in the description of the embodiments will be provided below. It is evident that, without the need for inventive effort, ordinary technicians in the field can also obtain other figures based on these.

FIG. 3 is a flowchart of a clock detection method in an embodiment of the present application.

The purpose, functional features, and advantages of the present application will be further described in conjunction with the embodiments, with reference to the figures. Through the aforementioned figures, specific embodiments of the present application have been illustrated, and more detailed descriptions will be provided in the following text. These figures and textual descriptions are not intended to limit the scope of the inventive concept in any way, but rather to illustrate the concepts of the present application to technicians in the field by referring to specific embodiments.

DETAILED DESCRIPTION

Here is a detailed explanation of the exemplary embodiments as illustrated in the accompanying drawings. Unless otherwise indicated, the same numbers in different figures represent the same or similar elements. The methods described in the following exemplary embodiments do not represent all possible implementations consistent with the present application. On the contrary, they are merely examples of devices and methods consistent with some aspects of the present application as detailed in the appended claims.

It should be noted that in this text, the terms "comprising," "including," or any other variations thereof are intended to encompass non-exclusive inclusion, such that a process, method, article, or device that includes a list of elements is not limited to those elements, and may also include other elements that are not expressly listed, or inherent in the process, method, article, or device. In the absence of additional limitations, elements defined by phrases such as "including a . . . " do not exclude the presence of additional same elements in the process, method, article, or device that includes the element. Furthermore, components, features, or elements with the same name in different embodiments of the application may have the same or different meanings, and their specific meanings should be determined based on their interpretation in the specific embodiment or further in conjunction with the context of that specific embodiment.

It should be understood that the specific embodiments described here are merely for the purpose of explaining the present application and are not intended to limit the scope of the application.

One Embodiment

Figure 1:
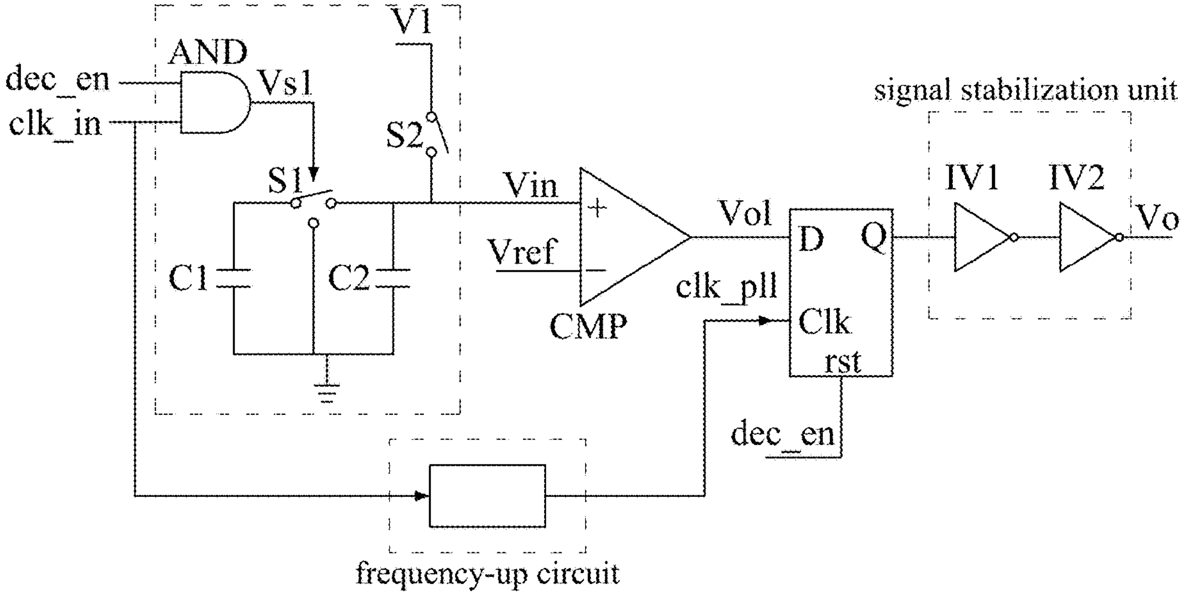
FIG. 1 is a schematic diagram of a clock detection circuit in an embodiment of the present application.

The present application provides a clock detection circuit, and FIG. 1 is a schematic diagram of a clock detection circuit in an embodiment of the present application.

As shown in FIG. 1, in one embodiment, the clock detection circuit includes a first AND gate (AND), a first switch element (S1), a second switch element (S2), a first capacitor (C1), a second capacitor (C2), a comparator (CMP), and a flip-flop (DFF).

Exemplarily, a clock circuit is an electronic circuit used for generating and distributing clock signals. Clock signals play a role in synchronizing and coordinating the operation of various components in digital systems, providing a unified time reference that allows data transmission and processing in the system to be carried out in the correct order and timing.

The first input end of the first AND gate (AND) receives an enable signal (dec_en), the second input end of the first AND gate (AND) receives a first clock signal (clk_in), and the output end of the first AND gate (AND) is connected to the control end of the first switch element (S1).

Exemplarily, an AND gate is a circuit that performs logical "AND" operation, having two or more input ends and one output end. The circuit outputs a high level (logical "1") only when all input ends are high (logical "1"), otherwise the output is a low level (logical "0").

The first end of the first capacitor (C1) is connected to the first end of the first switch element (S1), the second end of the first capacitor (C1) is grounded, the second capacitor (C2) is connected between the second end of the first switch element (S1) and ground, and the third end of the first switch element (S1) is grounded.

The first end of the second switch element (S2) receives a first preset voltage (V1), and the second end of the second switch element (S2) is connected to the second end of the first switch element (S1). The positive input end of the comparator (CMP) is connected to the second end of the second switch element (S2).

The negative input end of the comparator (CMP) receives a second preset voltage (Vref), and the output end of the comparator (CMP) is connected to the input end of the flip-flop (DFF).

Exemplarily, a comparator (CMP) is a circuit or device capable of performing comparison functions. A comparator is a circuit that compares an analog voltage signal with a reference voltage. The two input paths of a comparator are analog signals, and the output is a binary signal 0 or 1. When the difference in input voltage increases or decreases and the sign remains the same, the output remains constant.

The trigger end of the flip-flop (DFF) is connected to the second input end of the first AND gate (AND), the reset end of the flip-flop (DFF) is connected to the first input end of the first AND gate (AND), and the output end of the flip-flop (DFF) outputs a clock detection result signal (Vo).

Exemplarily, a flip-flop (DFF) is a memory element with two stable states, which is the most basic logical unit for constructing various timing circuits and is also an important unit circuit in digital logic circuits. Therefore, flip-flops (DFF) have a wide range of applications in digital systems and computers. Exemplarily, a D flip-flop has two stable states, 0 and 1, and can flip from one stable state to another under the action of certain external signals.

This embodiment receives an enable signal (dec_en) at the first input end of the first AND gate (AND), a first clock signal (clk_in) at the second input end of the first AND gate (AND), and connects the output end of the first AND gate (AND) to the control end of the first switch element (S1); the first end of the first capacitor (C1) is connected to the first end of the first switch element (S1), the second end of the first capacitor (C1) is grounded, the second capacitor (C2) is connected between the second end of the first switch element (S1) and ground, and the third end of the first switch element (S1) is grounded; the first end of the second switch element (S2) receives a first preset voltage (V1), the second end of the second switch element (S2) is connected to the second end of the first switch element (S1); the positive input end of the comparator (CMP) is connected to the second end of the second switch element (S2), the negative input end of the comparator (CMP) is connected to the second preset voltage (Vref), and the output end of the comparator (CMP) is connected to the input end of the flip-flop (DFF); the trigger end of the flip-flop (DFF) is connected to the second input end of the first AND gate (AND), the reset end of the flip-flop (DFF) is connected to the first input end of the first AND gate (AND), and the output end of the flip-flop (DFF) outputs a clock detection result signal (Vo). By employing the input system clock detection circuit, it is possible to determine whether the input system clock frequency meets the design requirements, thereby enhancing the user experience.

Optionally, the clock detection circuit may also include a frequency-up circuit, whose input end is connected to the second input end of the first AND gate (AND), and whose output end is connected to the trigger end of the flip-flop (DFF). The frequency-up circuit is used to increase the trigger frequency of the trigger end to avoid the delay in the clock detection result signal (Vo) output from the output end of the flip-flop (DFF).

Exemplarily, the first clock signal (clk_in) is converted by the frequency-up circuit into a second clock signal (clk_pll) with a higher frequency, which is output to the enable end of the flip-flop (DFF). This can increase the frequency of the enable signal (dec_en) at the enable trigger end of the flip-flop (DFF), avoiding a delay in the flip-flop (DFF) when the comparator (CMP) flips, thereby avoiding clock frequency errors.

Figure 2:
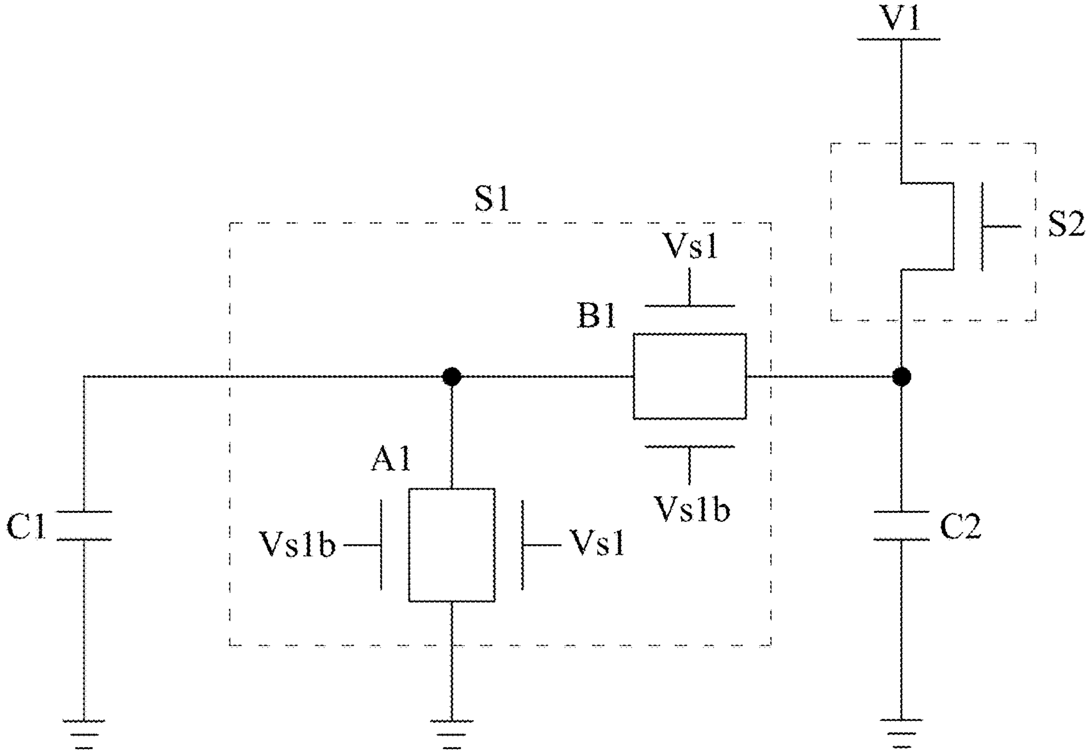
FIG. 2 is a schematic diagram of the connection architecture of the first and second switch elements in an embodiment of the present application.

FIG. 2 is a schematic diagram of the connection architecture of the first switch element (S1) and the second switch element (S2) in an embodiment of the present application.

As shown in FIG. 2, optionally, the first switch element (S1) includes a first transmission gate (A1) and a second transmission gate (B1).

The first control end of the first transmission gate (A1) receives the first control signal (Vs1) output from the output end of the first AND gate (AND), the second control end of the first transmission gate (A1) receives a second control signal (Vs1*b*), the input end of the first transmission gate (A1) serves as the first end of the first switch element (S1), and the output end of the first transmission gate (A1) is grounded.

The first control end of the second transmission gate (B1) receives the second control signal (Vs1*b*), the second control end of the second transmission gate (B1) receives the first control signal (Vs1) output from the output end of the first AND gate (AND), the output end of the second transmission gate (B1) is connected to the output end of the second switch element (S2), and the input end of the second transmission gate (B1) is connected to the input end of the first transmission gate (A1); Wherein, the first control signal (Vs1) and the second control signal (Vs1*b*) are complementary control signals.

Optionally, a clock differential output circuit may be connected at the output end of the first AND gate (AND) to generate two control signals that are inverses of each other, namely the first control signal (Vs1) and the second control signal (Vs1*b*). The clock differential output circuit includes but is not limited to any of the following structures: direct differential amplifier structure, transformer-coupled differential output, logic gate generation of differential signals, differential signal buffer structure, etc.

Exemplarily, a transmission gate (TG gate) is an electronic component mainly used for transmitting analog signals in analog switches. It is composed of a P-channel and an N-channel enhancement-type MOSFET connected in parallel, which can transmit signals in digital circuits. The main function of a TG gate is to allow or block current flow under specific conditions, thereby achieving signal transmission or blocking. In digital circuit logic design, the role of a TG gate (CMOS transmission gate) is similar to that of an open-collector (OC) gate. When the control signal is high, both the P-channel and N-channel MOSFETs conduct, allowing the signal to pass through to the output end; when the control signal is low, both cut off, and the output end presents a high-impedance state (Z). This characteristic allows the TG gate to play a role in level conversion, similar to an OC gate. Using multiple transmission gates with appropriate control voltages can achieve the effect of a single-pole multi-throw switch.

Optionally, the second switch element (S2) may be a field-effect transistor (FET).

Exemplarily, a field-effect transistor (FET) is a semiconductor device that controls the current flow in the output circuit by manipulating the electric field effect in the input circuit. There are two main types of FETs: the junction FET (JFET) and the metal-oxide semiconductor FET (MOSFET). FETs are known for their high input resistance, low noise, low power consumption, large dynamic range, ease of integration, absence of secondary breakdown, and a wide safe operating area.

Please refer to FIGS. 1 and 2, optionally, the clock detection circuit may also include a signal stabilization unit connected to the output end of the flip-flop (DFF).

Exemplarily, the signal output from the flip-flop (DFF) may have limited power and load-driving capability. Therefore, a signal stabilization unit can be used to stabilize the signal output from the flip-flop (DFF) and enhance its load-driving capability.

Optionally, the signal stabilization unit includes a first inverter (N1) and a second inverter (N2). The input end of the first inverter (N1) is connected to the output end of the flip-flop (DFF), and the output end of the first inverter (N1) is connected to the input end of the second inverter (N2), with the output end of the second inverter (N2) providing the clock detection result signal (Vo).

Exemplarily, by inverting the signal output from the flip-flop (DFF) through two NOT operations, the load-driving capability of the data output signal from the flip-flop (DFF) can be effectively improved, preventing data errors during data transmission and effectively enhancing the accuracy of data transmission.

Optionally, the value of the first preset voltage (V1) is greater than the second preset voltage (Vref).

Exemplarily, after the first preset voltage (V1) is charged to the second capacitor (C2), the voltage across the second capacitor (C2) equals the voltage value of the first preset voltage (V1). When the first switch element (S1) alternates conduction, the voltage across the second capacitor (C2) gradually decreases. When the voltage across the second capacitor (C2) drops below the voltage value of the second preset voltage (Vref), the output signal of the comparator (CMP) will flip.

Optionally, the capacitance value of the first capacitor (C1) is less than that of the second capacitor (C2).

Exemplarily, when the first switch element (S1) alternates conduction, the first end of the first capacitor (C1) switches between grounding and connecting to the first end of the second capacitor (C2). If the capacitance value of the first capacitor (C1) is much smaller than that of the second capacitor (C2), the node voltage at the positive input end of the comparator (CMP) will slightly decrease in each alternating cycle, causing the voltage across the second capacitor (C2) to gradually decrease.

Second Embodiment

The present application also provides a clock detection method applied to the aforementioned clock detection circuit. FIG. 3 is a flowchart of a clock detection method in an embodiment of the present application.

As shown in FIG. 3, in one embodiment, the clock detection method includes:

S10: by invalidating the enable signal, controlling the first switch element to ground both ends of the first capacitor, and controlling the second switch element to conduct and charge the second capacitor to the first preset voltage, wherein the first preset voltage is greater than the second preset voltage.

S20: controlling the second switch element to cut off, flipping the enable signal to be effective, based on the first clock signal, causing the first switch element to alternate conduction, to control the first end of the first capacitor to alternate between grounding and connecting to the second capacitor, so that an input voltage at the positive input end of the comparator conforms to a first preset function expression, wherein a capacitance value of the first capacitor is less than that of the second capacitor.

S30: when a voltage value of the second capacitor drops to less than the second preset voltage, the output voltage of the comparator flips, and based on the Taylor expansion of the first preset function expression, acting a pulse width of the clock detection result signal as a frequency detection result of the first clock signal.

Optionally, the first preset function expression is:

$$V_{in} = \left(1 - \frac{c_1}{c_1 + c_2}\right)^n V_1$$

The Taylor expansion expression of the first preset function expression is:

$$V_{in}=\left(1-n\frac{c_1}{c_1+c_2}+\frac{n(n-1)}{2}\left(\frac{c_1}{c_1+c_2}\right)^2+\dots\right)V_1$$

Wherein, $V_{in}$ is the input voltage at the positive input end of the comparator, $C_1$ is the capacitance value of the first capacitor, $C_2$ is the capacitance value of the second capacitor, $V_1$ is the voltage value of the first preset voltage, and n is the number of cycles.

Figure 4:
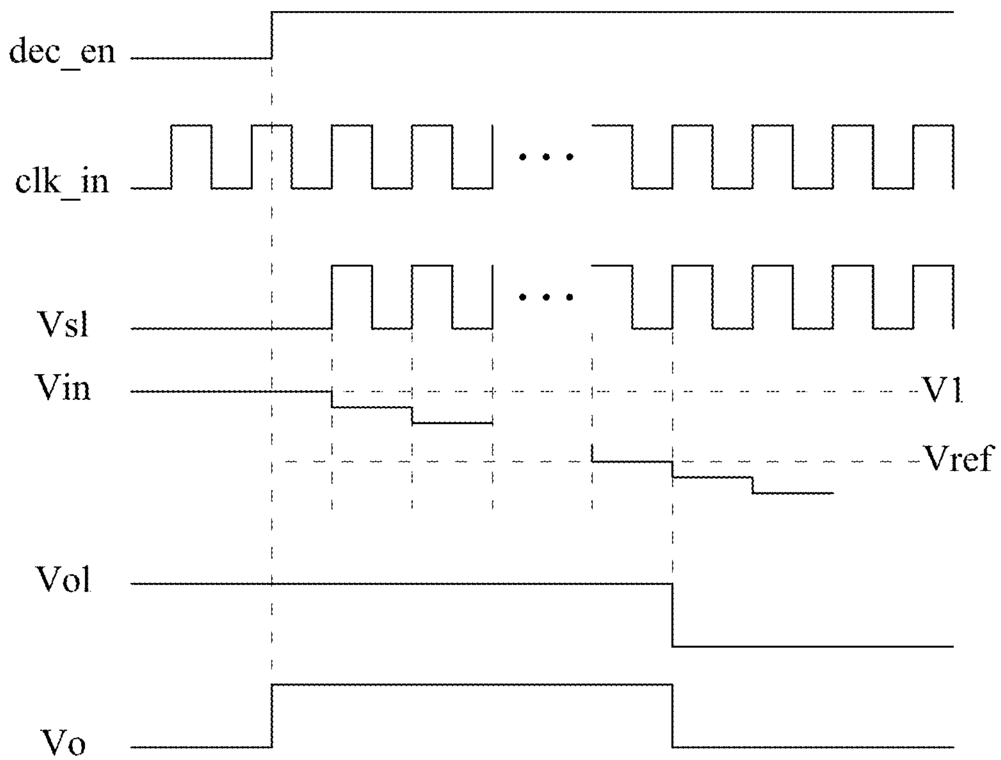
FIG. 4 is a timing diagram of key nodes in a clock detection embodiment of the present application.

FIG. 4 is a timing diagram of key nodes in a clock detection embodiment of the present application.

Please continue to refer to FIGS. 1, 2, 3, and 4; exemplarily, in the preparation phase, at this time, the enable signal (dec_en) is invalid, i.e., dec_en=0 is a low-level signal, the second switch element (S2) is conductive, at this time, both ends of the first capacitor (C1) are grounded; the upper plate of the second capacitor (C2) is charged to the first preset voltage (V1), the voltage value ($V_{ref}$) of the second preset voltage ($V_{ref}$) is lower than the voltage value $V_1$ of the first preset voltage V1 (for example, $V_{ref}=0.8*V_1$), the output voltage (Vo1) of the comparator (CMP) is a high-level signal; the flip-flop (DFF) is in a reset state, and the clock detection result signal (Vo) output by the flip-flop (DFF) is a low-level signal; before the end of the preparation phase, the second switch element (S2) is turned off, and the charge of the second capacitor (C2) is stored.

Exemplarily, in the detection phase, at this time, the enable signal (dec_en) changes from 0 to 1, the reset state of the flip-flop (DFF) ends, the output voltage Vo1 of the comparator (CMP), which is 1, i.e., a high-level signal, is transmitted to the output of the flip-flop (DFF), and the clock detection result signal Vo output by the flip-flop (DFF) changes from a low level 0 to a high level 1. Since the enable signal (dec_en) is a high-level signal, the first AND gate (AND) is valid, transmitting the first clock signal clk_in of the input system to the output end of the first AND gate (AND) to generate the first control signal (Vs1) at the first control end of the first switch element (S1) and the second control signal (Vs1*b*) at the second control end. The first switch element (S1) alternates conduction, and the positive end (i.e., the first end) of the first capacitor (C1) switches between grounding and connecting to the positive end of the second capacitor (C2), with the capacitance value of the first capacitor (C1) being much smaller than that of the second capacitor (C2) (for example, the ratio of the capacitance values of the first and second capacitors is $C_1=0.01*C_2$). In each cycle, the node voltage at the positive input end (Vin) of the comparator (CMP) will slightly decrease, and its voltage expression is as follows:

$$V_{in}=\left(1-\frac{c_1}{c_1+c_2}\right)^n V_1$$

Wherein n represents n cycles, and its Taylor expansion is as follows:

$$V_{in}=\left(1-n\frac{c_1}{c_1+c_2}+\frac{n(n-1)}{2}\left(\frac{c_1}{c_1+c_2}\right)^2+\dots\right)V_1$$

Optionally, the voltage value of the second preset voltage (Vref) is greater than the predetermined voltage value, and the predetermined voltage value is positively correlated with the precision of the frequency detection result of the first clock signal (clk_in). It needs to be explained that the precision of the frequency detection result of the first clock signal (clk_in) indicates whether it is only necessary to obtain the range of the clock detection result signal or to obtain the specific value. If only the range of the clock detection result signal is needed, the precision is low; if the specific value of the clock detection result signal is needed, the precision is high. Therefore, the higher the precision requirement, the larger the corresponding predetermined voltage value, and the larger the voltage value of the second preset voltage (Vref).

For a given first preset voltage (V1), second preset voltage (Vref), first capacitor (C1), and second capacitor (C2) capacitance values, determine the number of cycles required for the comparator (CMP) output to flip, making the input system clock frequency linearly related to the detection pulse width. By calibrating the upper and lower limits of the pulse width, it is possible to detect whether the system clock frequency meets the requirements.

Optionally, based on the Taylor expansion of the first preset function expression, the process of detecting the pulse width of the clock detection result signal as the frequency detection result of the first clock signal (clk_in) includes: fixing the number of cycles for the comparator (CMP) output to flip, making the frequency of the first clock signal (clk_in) linearly related to the pulse width of the clock detection result signal.

Optionally, based on the Taylor expansion of the first preset function expression, the process of detecting the pulse width of the clock detection result signal as the frequency detection result of the first clock signal includes:

According to the first clock signal (clk_in)'s clock frequency being directly proportional to the pulse width of the clock detection result signal, determine the detection result of the first clock signal based on the pulse width of the clock detection result signal.

Exemplarily, the number of cycles required for the comparator (CMP) output to flip is fixed, so the input system clock frequency is linearly related to the detection pulse width. By calibrating the upper and lower limits of the pulse width, it is possible to detect whether the system clock frequency meets the requirements.

Exemplarily, please continue to refer to FIGS. 2, 3, and 4. Since the capacitance value of the first capacitor C1 is much smaller than that of the second capacitor C2, the above Taylor expansion can be approximated by retaining only the first two terms, i.e.:

$$V_{in}=\left(1-n\frac{c_1}{c_1+c_2}\right)V_1$$

Thus, it can be obtained that the decrease in the voltage $V_{in}$ at the positive input end of the comparator is linearly related to n. At this time, the voltage value of the second preset voltage (Vref) is still lower than the voltage value of the first preset voltage (V1), the output voltage Vo1 of the comparator (CMP) is a high-level signal, and the clock detection result signal is a high-level signal.

Third Embodiment

The present application also provides an image sensor, including the aforementioned clock detection circuit.

The present application also provides an image sensor, which includes a memory and a processor, where the memory stores a computer program, and when the computer program is executed by the processor, it implements the steps of the aforementioned clock detection method.

The clock detection method, clock detection circuit, and image sensor provided by the present application, by receiving an enable signal at the first input end of the first AND gate, receiving a first clock signal at the second input end of the first AND gate, and connecting the output end of the first AND gate to the control end of the first switch element; connecting the first end of the first capacitor to the first end of the first switch element, grounding the second end of the first capacitor, connecting the second capacitor between the second end of the first switch element and ground, and grounding the third end of the first switch element; receiving the first preset voltage at the first end of the second switch element, connecting the second end of the second switch element to the second end of the first switch element; connecting the positive input end of the comparator to the second end of the second switch element, connecting the negative input end of the comparator to the second preset voltage, and connecting the output end of the comparator to the input end of the flip-flop; connecting the trigger end of the flip-flop to the second input end of the first AND gate, connecting the reset end of the flip-flop to the first input end of the first AND gate, and connecting the output end of the flip-flop to output the clock detection result signal. By employing the input system clock detection circuit, it is possible to determine whether the input system clock frequency meets the design requirements, thereby enhancing the user experience.

It should be noted that in the present application, step designations such as S10, S20, etc., are used solely for the purpose of clearly and concisely describing the content and do not constitute substantial limitations on the order. Technicians in this field may implement S20 before S10, etc., but all of these should be within the scope of protection of the present application.

In the embodiments of the image sensor and clock detection circuit provided in the present application, all technical features of the aforementioned method embodiments can be included. The content of the specification expansion and explanation is basically the same as the aforementioned method embodiments, and will not be repeated here.

The embodiment of the present application also provides a computer program product, which includes computer program code. When the computer program code is run on a computer, it causes the computer to execute methods as described in the various possible embodiments above.

The embodiment of the present application also provides a chip, which includes a memory and a processor. The memory is used to store computer programs, and the processor is used to call and run computer programs from the memory, causing devices equipped with the chip to execute methods as described in the various possible embodiments above.

It can be understood that the above scenarios are only exemplary and do not constitute a limitation on the application scenarios of the technical solutions provided by the embodiments of the present application. The technical solutions provided by the embodiments of the present application can also be applied to other scenarios. For example, technicians in this field know that with the evolution of system architectures and the emergence of new business scenarios, the technical solutions provided by the embodiments of the present application are equally applicable to similar technical problems.

The serial numbers of the embodiments in the present application are merely for description and do not represent the superiority or inferiority of the embodiments.

The steps in the method embodiments of the present application can be adjusted in order, merged, and reduced according to actual needs.

The units in the device embodiments of the present application can be merged, divided, and reduced according to actual needs.

In the present application, for the same or similar terms, concepts, technical solutions, and/or application scenarios, only the first occurrence is described in detail. For subsequent occurrences, to be concise, they are generally not reiterated. When understanding the technical solutions and other contents of the present application, for the same or similar terms, concepts, technical solutions, and/or application scenarios that are not described in detail later, reference can be made to the previous relevant detailed descriptions.

In the present application, the descriptions of each embodiment focus on different aspects. Parts that are not described or recorded in detail in one embodiment can refer to the relevant descriptions in other embodiments.

The technical features of the technical solutions in the present application can be combined arbitrarily. To keep the description concise, not all possible combinations of the technical features in the aforementioned embodiments are described. However, as long as there are no contradictions between these technical features, they should be considered within the scope of the present application.

The above are only the preferred embodiments of the present application and do not limit the patent scope of the present application. Any equivalent structures or processes derived from the content of the present application's specification and drawings, or directly or indirectly applied in other related technical fields, are also included within the patent protection scope of the present application.

What is claimed is:

1. A clock detection circuit, wherein it comprises a first AND gate, a first switch element, a second switch element, a first capacitor, a second capacitor, a comparator, and a flip-flop;

a first input end of the first AND gate is configured to receive an enable signal, a second input end of the first AND gate is configured to receive a first clock signal, and an output end of the first AND gate is connected to a control end of the first switch element;

a first end of the first capacitor is connected to a first end of the first switch element, a second end of the first capacitor is grounded, and the second capacitor is connected between a second end of the first switch element and ground, and a third end of the first switch element grounded;

a first end of the second switch element is connected to a first preset voltage, and a second end of the second switch element is connected to the second end of the first switch element;

a positive input end of the comparator is connected to the second end of the second switch element, a negative input end of the comparator is connected to a second preset voltage, and an output end of the comparator is connected to an input end of the flip-flop;

a trigger end of the flip-flop is connected to the second input end of the first AND gate, a reset end of the flip-flop is connected to the first input end of the first AND gate, and an output end of the flip-flop outputs a clock detection result signal.

2. The clock detection circuit according to claim 1, the clock detection circuit further comprises a frequency-up circuit, wherein an input end of the frequency-up circuit is connected to the second input end of the first AND gate, and an output end of the frequency-up circuit is connected to the trigger end of the flip-flop, the frequency-up circuit is configured to increase trigger frequency of the trigger end to avoid the delay in the clock detection result signal outputted from the output end of the flip-flop.

3. The clock detection circuit according to claim 2, the first switch element comprises a first transfer gate and a second transfer gate;

a first control end of the first transfer gate is configured to receive the first control signal outputted from the output end of the first AND gate, the second control end of the first transfer gate is configured to receive a second control signal, an input end of the first transfer gate is served as the first end of the first switch element, and an output end of the first transfer gate is grounded;

a first control end of the second transfer gate is connected to the second control signal, a second control end of the second transfer gate is configured to receive the first control signal output from the output end of the first AND gate, an output end of the second transfer gate is connected to the second end of the second switch element, and an input end of the second transfer gate is connected to the input end of the first transfer gate;

wherein, the first control signal and the second control signal are complementary control signals.

4. The clock detection circuit according to claim 3, the second switch element is a field-effect transistor.

5. The clock detection circuit according to claim 1, the clock detection circuit further comprises a signal stabilization unit, wherein the signal stabilization unit is connected to the output end of the flip-flop.

6. The clock detection circuit according to claim 5, the signal stabilization unit comprises a first NOT gate and a second NOT gate, wherein an input end of the first NOT gate is connected to the output end of the flip-flop, an output end of the first NOT gate is connected to an input end of the second NOT gate, and the output end of the second NOT gate outputs the clock detection result signal.

7. The clock detection circuit according to claim 1, the clock detection circuit is wherein the first preset voltage is greater than the second preset voltage.

8. The clock detection circuit according to claim 7, a capacitance value of the first capacitor is less than a capacitance value of the second capacitor.

9. A clock detection method, wherein it is applied to the clock detection circuit as described in claim 1, the clock detection method comprises:

by invalidating the enable signal, controlling the first switch element to ground both ends of the first capacitor, controlling the second switch element to conduct and charge the second capacitor to the first preset voltage, wherein the first preset voltage is greater than the second preset voltage;

controlling the second switch element to cut off, flipping the enable signal to be effective, based on the first clock signal, causing the first switch element to alternate conduction, to control the first end of the first capacitor to alternate between grounding and connecting to the second capacitor, so that an input voltage at the positive input end of the comparator conforms to a first preset function expression, wherein a capacitance value of the first capacitor is less than a capacitance value of the second capacitor;

when a voltage value of the second capacitor drops to less than the second preset voltage, the output voltage of the comparator flips, and based on the Taylor expansion of the first preset function expression, acting a pulse width of the clock detection result signal as a frequency detection result of the first clock signal.

10. The clock detection method according to claim 9, the first preset function expression is:

$$V_{in} = \left(1 - \frac{C_1}{C_1 + C_2}\right)^n V_1$$

the Taylor expansion expression of the first preset function expression is:

$$V_{in} = \left(1 - n\frac{C_1}{C_1 + C_2} + \frac{n(n-1)}{2}\left(\frac{C_1}{C_1 + C_2}\right)^2 + \dots\right)V_1$$

wherein, $V_{in}$ is the input voltage at the positive input end of the comparator, $C_1$ is the capacitance value of the first capacitor, $C_2$ is the capacitance value of the second capacitor, $V_1$ is the voltage value of the first preset voltage, and n is a number of cycles.

11. The clock detection method according to claim 9, the second preset voltage is greater than a predetermined voltage value, and the predetermined voltage value is positively correlated with a precision of the frequency detection result of the first clock signal.

12. The clock detection method according to claim 11, a process of acting the pulse width of the clock detection result signal as the frequency detection result of the first clock signal based on the Taylor expansion of the first preset function expression comprises: fixing a number of cycles for the comparator output to flip, making the frequency of the first clock signal linearly related to the pulse width of the clock detection result signal.

13. The clock detection method according to claim 12, a process of detecting the pulse width of the clock detection result signal as the frequency detection result of the first clock signal based on the Taylor expansion of the first preset function expression comprises: according to the first clock signal's clock frequency being directly proportional to the pulse width of the clock detection result signal, determining the detection result of the first clock signal through the pulse width of the clock detection result signal.

14. An image sensor, comprising a memory and a processor, wherein the memory stores a computer program, and the computer program, when executed by the processor, implements the steps of the clock detection method as described in claim 9.

15. An image sensor, comprising the clock detection circuit as described in claim 1.

* * * * *